(12) United States Patent  
Hasegawa

(10) Patent No.: US 7,375,001 B2  
(45) Date of Patent: May 20, 2008

(54) SEMICONDUCTOR DEVICE AND METHOD THEREFORE

(75) Inventor: Hisashi Hasegawa, Chiba (JP)

(73) Assignee: Seiko Instruments Inc. (JP)

( * ) Notice: Subject to any disclaimer, the term of this patent is extended or adjusted under 35 U.S.C. 154(b) by 450 days.

(21) Appl. No.: 11/209,057

(22) Filed: Aug. 22, 2005

(65) Prior Publication Data  
US 2006/0035421 A1 Feb. 16, 2006

Related U.S. Application Data

(62) Division of application No. 10/395,675, filed on Mar. 24, 2003, now Pat. No. 7,002,235.

(30) Foreign Application Priority Data

| Mar. 25, 2002 | (JP) | ............................... 2002-084020 |
| Jul. 1, 2002 | (JP) | ............................... 2002-191837 |
| Mar. 12, 2003 | (JP) | ............................... 2003-066896 |

(51) Int. Cl.  
*H01L 21/20* (2006.01)

(52) U.S. Cl. ...................... 438/384; 438/238; 438/382; 438/385

(58) Field of Classification Search ................ 438/238, 438/381, 382, 384, 385  
See application file for complete search history.

(56) References Cited

U.S. PATENT DOCUMENTS

| 4,950,619 | A | * | 8/1990 | Yoon et al. .................. 438/384 |
| 5,793,097 | A | * | 8/1998 | Shimamoto et al. ........ 257/538 |
| 5,856,702 | A | * | 1/1999 | Hashimoto ................... 257/538 |
| 6,090,648 | A | * | 7/2000 | Reedy et al. ................ 438/155 |
| 6,229,165 | B1 | * | 5/2001 | Sakai et al. .................. 257/291 |
| 6,261,916 | B1 | * | 7/2001 | Re et al. ...................... 438/385 |

* cited by examiner

*Primary Examiner*—Zandra V. Smith  
*Assistant Examiner*—Khanh Duong  
(74) *Attorney, Agent, or Firm*—Adams & Wilks

(57) ABSTRACT

Where the silicon active layer of an SOI substrate is used as a resistor, it is difficult to form small wells densely in a semiconductor support substrate portion under the resistor because of the presence of a buried insulation film. It is also difficult to control the potential division of the wells. Therefore, there is the problem that the resistance value is varied by potential variations. Island-like silicon active layer and buried insulation film are formed by etching. Side spacers made of polycrystalline silicon are formed on the sidewalls of step portions of the island-like silicon active layer, buried insulation film, and semiconductor support substrate. The potentials at the side spacers are controlled. Thus, resistance value variations due to variations in the potential difference between the semiconductor support substrate and the resistor can be suppressed. Furthermore, accurate potential division owing to each resistor is facilitated.

6 Claims, 7 Drawing Sheets

SEMICONDUCTOR DEVICE AND METHOD THEREFORE

CROSS REFERENCE TO RELATED APPLICATIONS

The present application is a division of U.S. application Ser. No. 10/395,675, filed on Mar. 24, 2003 now U.S. Pat. No. 7,002,235, which is hereby incorporated by reference, and priority thereto for common subject matter is hereby claimed.

BACKGROUND OF THE INVENTION

1. Field of the Invention

The present invention relates to a complementary MOS semiconductor device having a resistance circuit formed on an SOI (silicon on insulator) substrate.

2. Description of the Related Art

Complementary MOS (CMOS) semiconductor integrated circuits having resistance circuits have been heretofore used in large numbers.

The resistance circuits include resistors used in a bleeder voltage-dividing circuit for voltage-dividing a voltage or in a CR circuit for setting a time constant. In analog semiconductor devices (such as comparators and operational amplifiers), voltage detectors, and power management semiconductor devices (such as constant voltage regulators and switching regulators), especially in analog circuits, voltages need to be divided accurately by a bleeder voltage-dividing circuit. Therefore, the characteristic that the bleeder resistor is required to have is a high resistance ratio accuracy. For example, in a voltage detector (VD), the ratio of the area of the resistance circuit to the chip area is very large and so reducing the area of the resistive element at high accuracy will lead to a decrease in the chip area. Consequently, the cost can be curtailed.

Polycrystalline silicon is generally used as the material of this resistive element. Where polycrystalline silicon is used as a resistor, the resistance value depends greatly on the crystal grain diameter of the polycrystalline silicon, on the grain boundaries, and on the film thickness. Therefore, the resistance value varies according to the state of fabrication equipment for depositing polycrystalline silicon by a CVD (chemical vapor deposition) method. Furthermore, polycrystalline silicon is patterned and etched to form resistors. If the area of a resistor is reduced, conspicuous variations in resistance value appear due to variations in etching. This makes it difficult to maintain the resistance ratio accuracy of the resistance circuit.

Where this resistor is formed by making use of the silicon active layer of an SOI substrate that is a single crystal of silicon, variations in resistance dependent on grain boundaries do not exist at all because there are no grain boundaries in the resistor. Furthermore, it is possible to increase the resistance of the resistor and to reduce the area. Consequently, it is quite effectively used as a resistor. In addition, where silicon etching is used instead of LOCOS isolation to pattern a single-crystal silicon resistor, the single-crystal silicon is processed at higher accuracy than polycrystalline silicon. Therefore, etching variations can be reduced. In consequence, single-crystal silicon is advantageously used as a resistor (for example, see Reference 1 (JP-A-2001-144254 (FIG. 1")).

An accurate voltage division ratio, i.e., a high resistance ratio accuracy, is required as a characteristic for a resistor used in an analog circuit. Therefore, it is necessary to minimize resistance value variations due to variations in the potential applied to the resistor. Accordingly, in a bulk CMOS process, wells for fixing the potential are formed under the resistor.

However, where the silicon active layer in the SOI substrate is used as a resistor, fine wells are formed densely in the semiconductor support substrate portion under the resistor because of the presence of a buried insulating layer. Furthermore, it is difficult to provide voltage-dividing control of the wells. This incurs the problem that the resistance value is varied by potential variations.

SUMMARY OF THE INVENTION

To solve the foregoing problems, the present invention uses the following means.

(1) A semiconductor device formed on an SOI (silicon on insulator) substrate consisting of a semiconductor support substrate, a buried insulation film that is an insulation film formed on the semiconductor support substrate, and a silicon active layer formed on the buried insulation film. In this semiconductor device, parts of the silicon active layer and parts of the buried insulation film have been removed such that the silicon active layer and buried insulation film shaped like islands are present on the semiconductor support substrate. A resistance circuit is formed using the island-like silicon active layer as single-crystal silicon resistors.

(2) A semiconductor device having side spacers made of a first polycrystalline silicon. The side spaces are formed over the sidewalls of step portions of the silicon active layer becoming the single-crystal silicon resistors, the buried insulation film, and the semiconductor support substrate via an insulation film.

(3) A semiconductor device characterized in that the silicon active layer thickness becoming the single crystal silicon resistors is 0.1 to 0.5 μm.

(4) A semiconductor device characterized in that the buried insulation film thickness is 0.1 μm to 0.5 μm.

(5) A semiconductor device characterized in that the side spacers formed on the sidewalls of the step portions of the silicon active layer and the semiconductor support substrate are connected by metal lead wires and that potential control of the side spacers is possible.

(6) A semiconductor device characterized in that a second polycrystalline silicon layer that is the same as the gate electrode material of MOS transistors is positioned over the single-crystal silicon resistors via an oxide film insulation film. The second polycrystalline silicon is connected by metal lead wires. Potential control of the second polycrystalline silicon is possible.

(7) A semiconductor device characterized in that a metallization layer is positioned over the second polycrystalline silicon via an interlayer dielectric film, the second polycrystalline silicon being positioned over the single-crystal silicon resistors. Potential control of the metallization layer is possible.

(8) A semiconductor device characterized in that a resistance circuit consisting of the island-like silicon active layer is composed of a single-crystal silicon resistor of a first conductivity type and a single-crystal silicon resistor of a second conductivity type.

(9) A method of fabricating a semiconductor device formed on an SOI (silicon on insulator) substrate consisting of a semiconductor support substrate, a buried insulation film formed on the semiconductor support substrate, and a silicon active layer formed on the buried insulation film. This method comprises the steps of: patterning the silicon active layer to form single-crystal silicon resistors; etching away some regions of the silicon active layer and some regions of the buried insulation film to form island-like silicon active layer and buried insulation film on the semiconductor support substrate to thereby form the single-crystal silicon resistors; forming an insulation film to a thickness of 0.01 μm to 0.04 μm by thermal oxidation; depositing a first polycrystalline silicon to a thickness comparable to the depth from the silicon active layer to the semiconductor support substrate surface portion; etching the first polycrystalline silicon by anisotropic dry-etching until the insulation film surface is exposed, to form side spacers over sidewalls of step portions of the island-like silicon active layer, the buried insulation film, and the semiconductor support substrate via the insulation film; implanting a dopant of a first conductivity type at $1\times10^{14}$ to $9\times10^{14}$ atoms/cm$^3$ into the whole or a first region of the single-crystal silicon resistors; implanting a dopant of a second conductivity type at $1\times10^{14}$ to $9\times10^{18}$ atoms/cm$^3$ into a second region of the single-crystal silicon resistors; forming a gate insulation film on the single-crystal silicon resistors and depositing a second polycrystalline silicon becoming gate electrodes; patterning and etching the second polycrystalline silicon to form gate electrodes over parts of the single-crystal silicon resistors; implanting a dopant of the first conductivity type at more than $1\times10^{19}$ atoms/cm$^3$ into some or whole region of the first region of the single-crystal silicon substrate; implanting a dopant of the second conductivity type at more than $1\times10^{19}$ atoms/cm$^3$ into some or whole region of the second region of the single-crystal silicon resistor; forming an intermediate insulation film on the SOI substrate; forming contact holes in the intermediate insulation film on the SOI substrate; forming metal lead wires in the contact holes; and forming a protective film.

(10) A semiconductor fabrication method characterized in that isotropic wet-etching is used for removal of the buried insulation film after removal of the silicon active layer.

(11) A semiconductor fabrication method characterized in that anisotropic dry-etching is used for removal of the buried insulation film after removal of the silicon active layer.

(12) A semiconductor fabrication method characterized in that the buried insulation film is removed by etching halfway through the buried insulation film by anisotropic dry etch and wet-etching the remaining buried insulation film isotropically after removal of the silicon active layer.

(13) A semiconductor fabrication method characterized in that the dopant implantation of the first conductivity type into some or whole region of the first region of the single-crystal silicon resistors at more than $1\times10^{19}$ atoms/cm$^3$ is carried out simultaneously with doping of a diffusion region of a MOS transistor of the first conductivity type and that the dopant implantation of the second conductivity type into some or whole region of the second region of the single-crystal silicon resistor is carried out simultaneously with doping of the diffusion region of a MOS transistor of the second conductivity type.

DETAILED DESCRIPTION OF THE PREFERRED EMBODIMENTS

Figure 1:
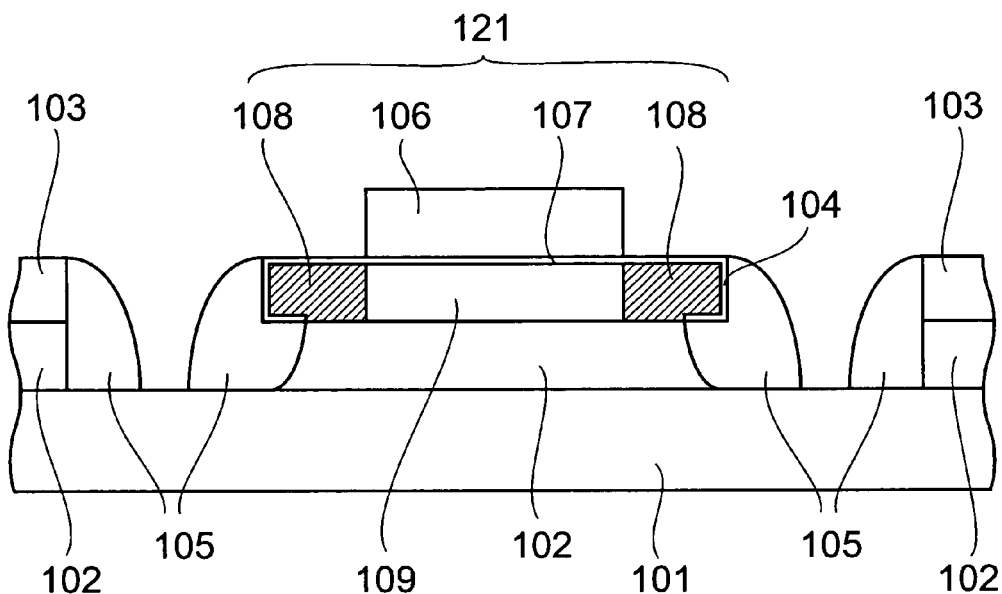
FIG. 1 is a cross-sectional view taken along cross-sectional line A-A' in FIG. 2 showing one embodiment of the semiconductor device of the present invention.

Embodiments of the present invention are hereinafter described in detail using the drawings. FIG. 1 is a cross-sectional view of a resistor of a single-crystal silicon active layer that is one embodiment of the present invention.

In the present embodiment, an N-resistor is shown as an example of the resistor. An SOI substrate is composed of a p-type semiconductor support substrate 101, a buried insulation film 102 consisting chiefly of an oxide film, and a P-type silicon active layer 103. In this SOI substrate, an N-resistor 121 having N+ single-crystal silicon regions 108 and a high-resistance N-single-crystal silicon region 109 is formed by etching and patterning the silicon active layer 103, the N+ single-crystal silicon regions 108 being heavily doped regions for making sufficient contact with a metallization material. The N+ single-crystal silicon regions 108 are at both ends of single-crystal silicon. The dopant concentration of this high-resistance N-single-crystal silicon region 109 is controlled by ion implantation to form the resistor having a desired resistance value. Side spacers 105 consisting of a first polycrystalline silicon are formed over the sidewalls, of the N-resistor 121 via an insulation film 104. The device is so constructed that the potential is fixed by the side spacers. A gate electrode 106 is placed in an upper portion of the N-resistor 121 of single-crystal silicon via a gate insulation film 107. Note that metal lead wires are omitted here.

The description is made here using an N-resistor. The resistance circuit may also be made of a p-resistor where the conductivity type of the resistor is p type. Also, at this time, the p-resistor has a high-resistance region and heavily doped regions similarly to the N type. The resistance value is set by the dopant concentration of the high-resistance region. Only the N-resistor 121 is shown in FIG. 1. Both N-resistor and p-resistor may be included in some cases, taking account of the characteristics of the resistors and the characteristics that the final product is required to have.

Variations in the resistance value due to variations in crystal grain diameter present problems when polycrystalline silicon is used in a resistor or resistors. The variations can be circumvented by using a silicon active layer of single-crystal silicon. In the case of polycrystalline silicon resistors, those having sheet resistance values of 5 kλ/to 20 kλ/are normally used. Since the relation between the dose of ion introduction owing to ion implantation and the resistance value varies exponentially, where the resistance value is set to a high resistance of about tens of kλ/□ to hundreds of kλ/□, a small amount of variation in the dose will greatly vary the resistance value. Accordingly, variations in the ion implantation step make conspicuous resistance variations. Therefore, it is difficult to increase the resistance in polycrystalline silicon. On the other hand, in the case of a resistor made of single-crystal silicon, the correlational relation between the dose and the resistance value is a linear relation.

Therefore, even on the high-resistance side, resistance value control is easy. The resistance of the resistor can be increased. This leads to a decrease in the area of the resistance circuit. Therefore, single-crystal silicon resistors become quite effective. Since etching is performed to the buried insulation film 102, devices can be formed on the P-type semiconductor support substrate 101.

Figure 2:
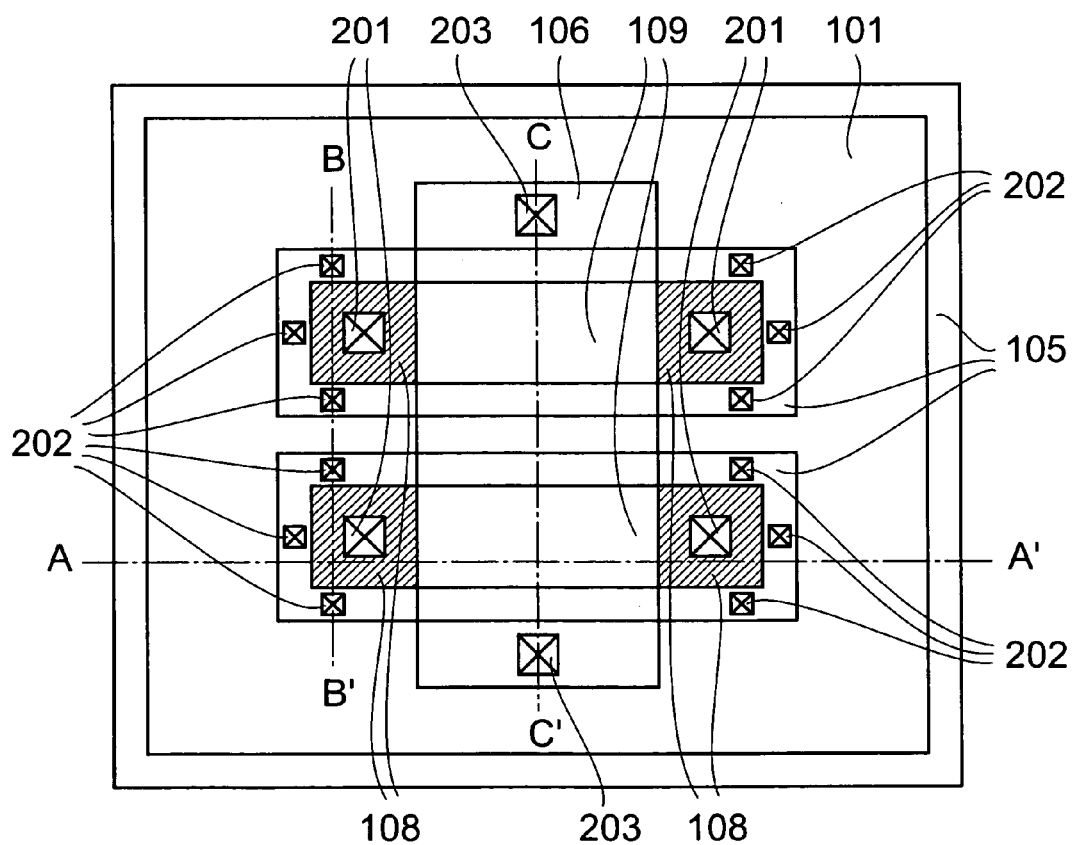
FIG. 2 is a plan view showing one embodiment of the semiconductor device of the invention.
Figure 3:
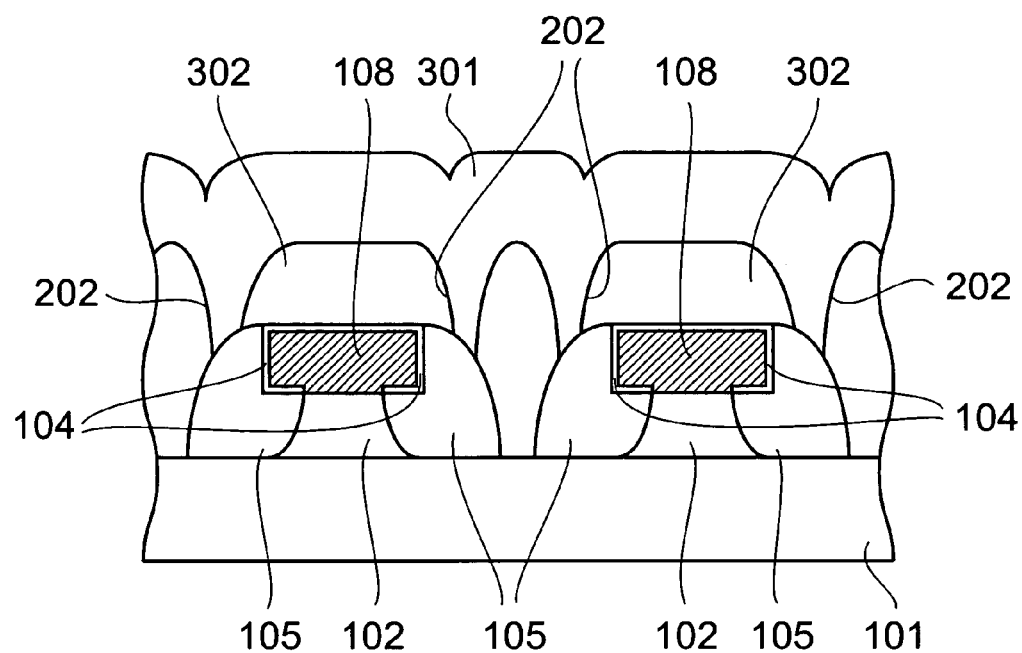
FIG. 3 is a cross-sectional view taken along cross-sectional line B-B' of FIG. 2.

FIG. 2 shows one example of a plan view of N-resistors utilizing the P-type silicon active layer 103 that is single-crystal silicon. In this figure, two resistors are arrayed. A cross section taken across A-A' of FIG. 2 corresponds to FIG. 1. A cross section taken across B-B' is shown in FIG. 3.

Metal lead wires are connected via contact holes 202 to the side spacers 105 which are made of polycrystalline silicon and formed on the sidewalls of the N-resistors 121. Arbitrary potential fixing can be performed.

The periphery of the N-resistors 121 of single-crystal silicon is fully surrounded by the side spacers 105. Potential fixing owing to the side spacers makes the N-resistors 121 immune to the effects of potential variations from the P-type semiconductor support substrate 101. Especially, there is the buried insulation film 102 under the N-resistors 121. This makes it difficult to form wells accurately in the P-type semiconductor support substrate 101 that is under the buried film. There is a fear that the resistance value is varied by potential difference variations between the semiconductor support substrate and the single-crystal silicon resistor. Resistance value variations due to variations in the potential difference with the resistor can be suppressed by forming the side spacers. Furthermore, potential division of the side spacers on each resistor is facilitated. The buried insulation film thickness is 0.1 μm to 0.5 μm. Variations in the resistance value can be suppressed by potential fixing of the side spacers even if the inter-semiconductor support substrate potential varies, by setting the film thickness of the silicon oxide film insulation film between the single-crystal silicon resistor and the side spacers to about 0.01 μm to 0.04 μm, for example. The contacts 202 may be placed at arbitrary positions if metal lead wires are joined to the side spacers.

Because of this structure, if the P-type silicon active layer 103 and buried insulation film 102 thicken and steps are produced by etching, step relaxation can be achieved by the side spacers 105. Nonuniformity of the coating in coating of photoresist can be prevented.

Furthermore, to achieve potential fixing of the N-resistors 121, the gate electrode 106 made of a second polycrystalline silicon is placed in a higher portion of the N-resistors 121.

Figure 4:
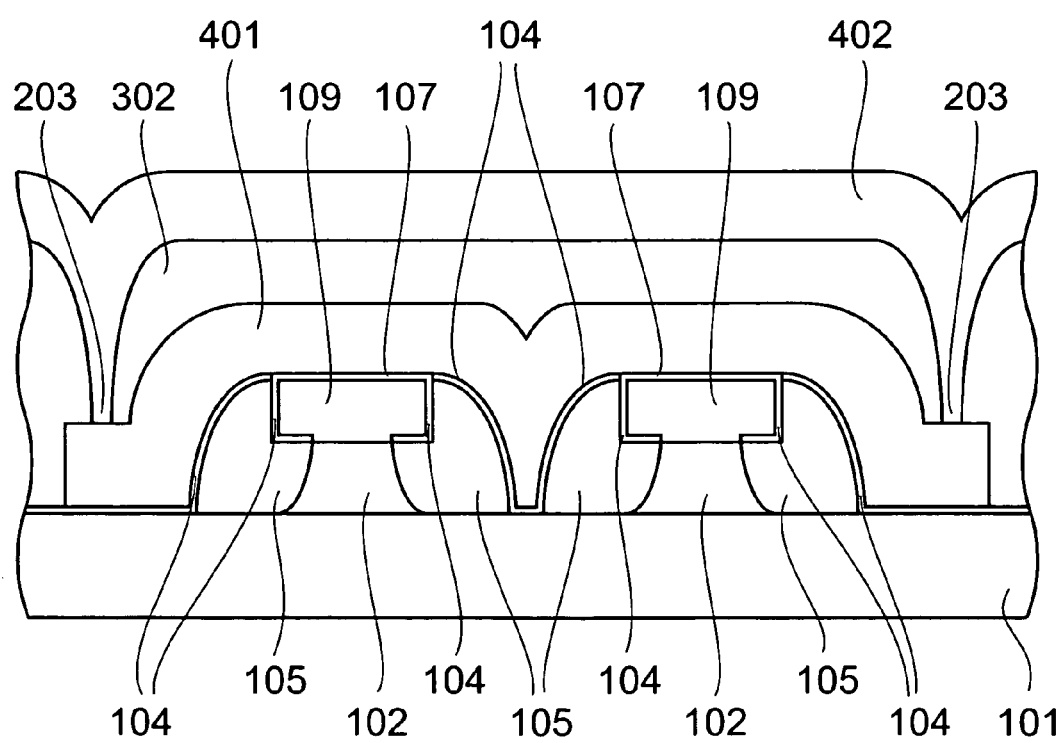
FIG. 4 is a cross-sectional view taken along cross-sectional line C-C' of FIG. 2.

FIG. 4 shows a cross-sectional view taken across C-C' of FIG. 2. Polycrystalline silicon 401 becoming gate electrodes is laminated on top of the N-resistors. This makes it possible to fix the potential vertically across the N-resistors 121. Furthermore, a metallization layer is positioned via an interlayer dielectric film to fix the potential further.

Figure 7:
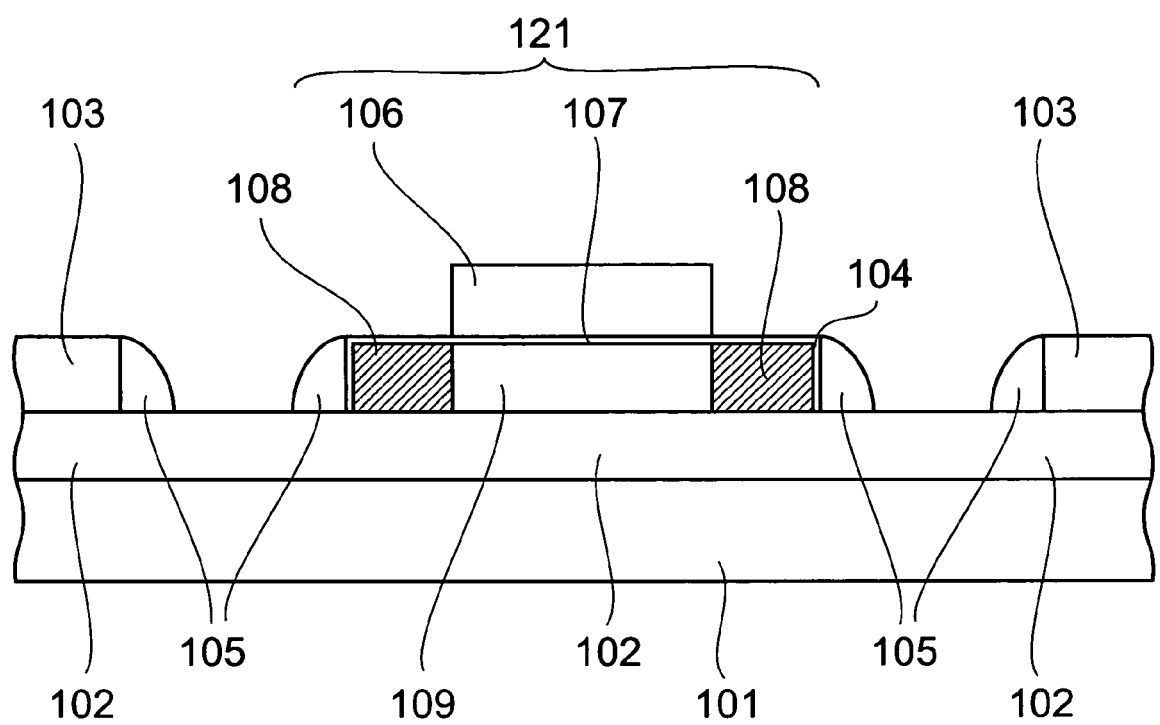
FIG. 7 is a cross-sectional view showing another embodiment of the semiconductor device of the invention.

Note that in FIG. 1 that is the present invention, the P-type silicon active layer 103 and buried insulation film 102 are both etched to form a resistor. As shown in FIG. 7, a structure is also possible in which the buried insulation film 102 is not etched but only the P-type silicon active layer 103 is etched to form a resistor, and in which side spacers are formed on the sidewalls of the resistor.

The semiconductor device of FIG. 1 is next described in further detail with reference to FIGS. 5A-5E showing an example of fabrication sequence. The buried insulation film 102 having a film thickness of 0.1 μm to 0.5 μm is formed on the P-type semiconductor support substrate 101 of P-type conductivity. The P-type silicon active layer 103 of P-type conductivity having a film thickness of 0.1 μm to 0.5 μm is formed on the buried insulation film 102. Thus, a bonded SOI substrate is prepared. The thickness of the buried insulation film 102 of this SOI substrate and the thickness of the P-type silicon active layer 103 are determined by the characteristics that CMOS devices formed on the silicon active layer need. An SOI substrate where the semiconductor support substrate and silicon active layer differ in concentration or an SOI substrate where the semiconductor support substrate and silicon active layer differ in conductivity type may also be used. Where the silicon active layer and semiconductor support substrate are of the same conductivity type and the substrate concentration is equal, a SIMOX substrate may also be used.

Figure 5A:
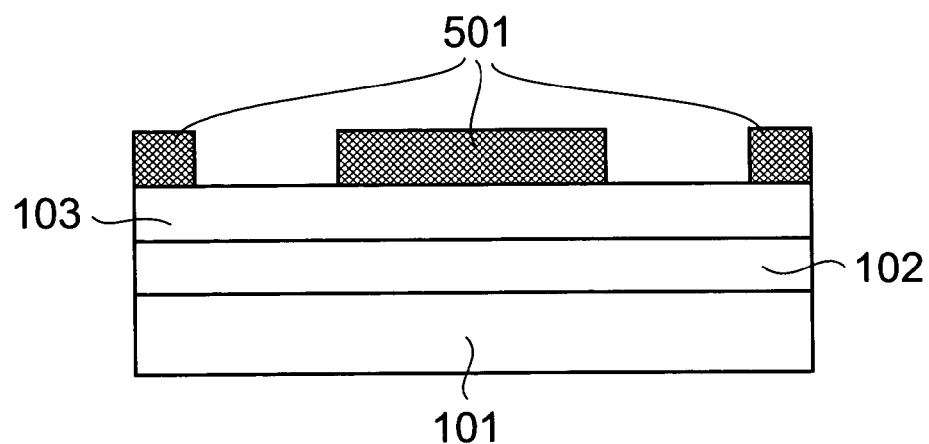
FIGS. 5A-5E show a process sequence in cross section showing one embodiment of the method of fabricating a resistor in the semiconductor device of the invention.
Figure 5B:
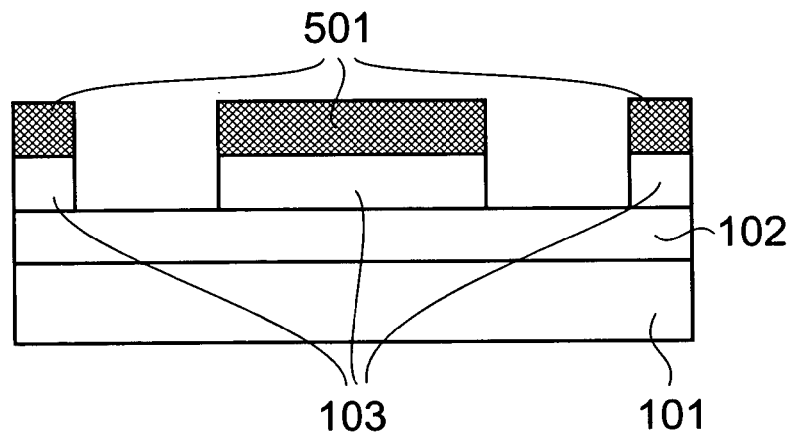
Figure 5C:
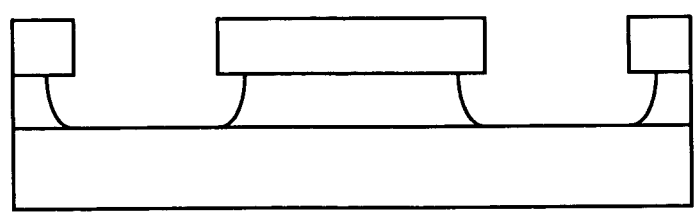

Photoresist SOI is coated on this SOI substrate. A resistor to be formed on the P-type silicon active layer 103 is patterned (FIG. 5A). Using this resist pattern 501 as a mask material, the P-type silicon active layer 103 is etched by RIE anisotropic dry etch until the buried insulation film 102 is exposed (FIG. 5B). Using the photoresist 501 as a mask material, the buried insulation film 102 is etched by wet etching (FIG. 5C). With respect to wet etch, the etching progresses isotropically and so the buried insulation film 102 is side-etched. However, the polycrystalline silicon 502 deposited subsequently by a CVD method provides good coverage during film formation and, therefore, the polycrystalline silicon moves unstraight and deposits even to the side-etched portions. Thus, the potential fixing effect of the side spacers on the formed resistor acts on parts under the resistor, as well as on the side portions.

Figure 5D:
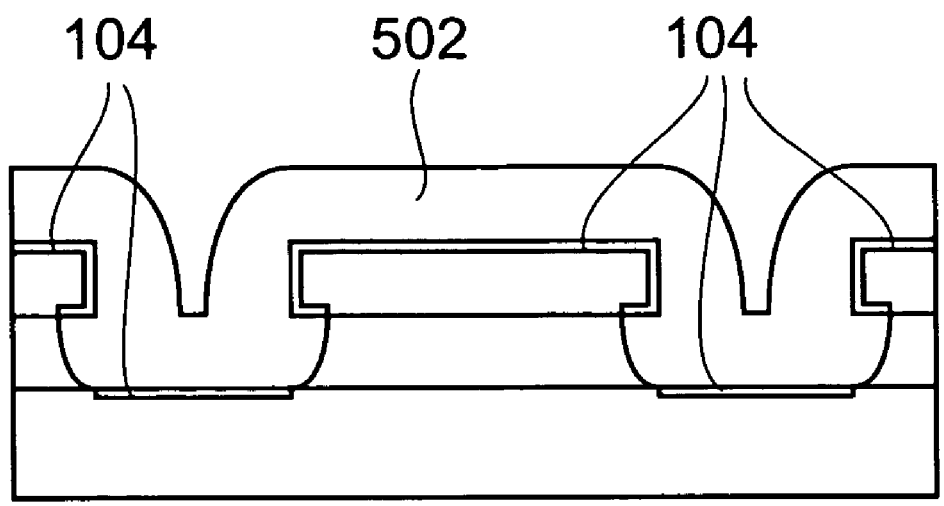
Figure 5E:
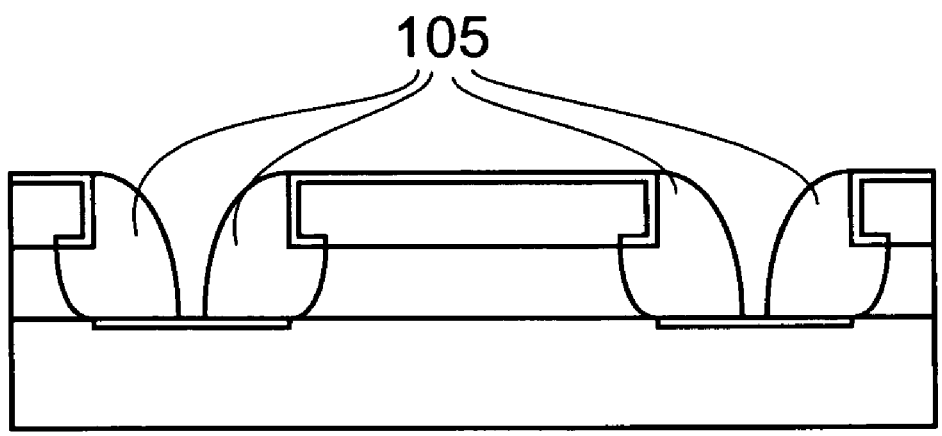

In the present embodiment, removal of the buried insulation film has been described using wet etch. RIE anisotropic dry etch may also be used. Furthermore, the dry etch may be halted halfway, and the remaining buried insulation film may be removed by wet etch. By using isotropic wet etch for removal of the buried insulation film 102, the P-type semiconductor support substrate 101 is not damaged. Consequently, devices can be fabricated on this P-type semiconductor support substrate 101. Then, thermal oxidation is performed to form the insulation film 104 between the P-type silicon active layer 103 and P-type semiconductor support substrate 101. The film thickness of the insulation film owing to this thermal oxidation is about 0.01 μm to 0.04 μm. The first polycrystalline silicon 501 is deposited on this insulation film by a reduced-pressure CVD method (FIG. 5D). At this time, the polycrystalline silicon moves unstraight and deposits on eaves-like portions formed by lateral etch of the buried insulation film 102 owing to the wet etching. The film thickness of this polycrystalline silicon 501 is set equivalent to the depth from the silicon active layer to the semiconductor support substrate. Then, the polcrystalline silicon film 501 is etched by RIE anisotropic dry etch until the underlying insulation film 104 is exposed. Thus, the side spacers 105 of polycrystalline silicon are formed on the sidewalls of the step portions of the P-type silicon active layer 103 and P-type semiconductor support substrate 101 (FIG. 5E). Because of these steps, an effect that the step shape produced by the formation of the semiconductor support substrate opening portion is improved can be expected.

Figure 6A:
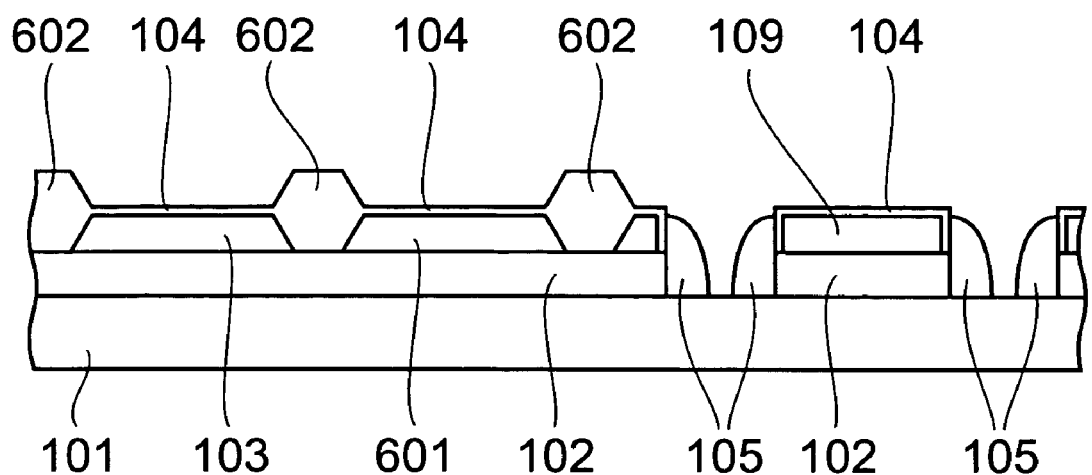
FIGS. 6A-6D show a process sequence in cross section showing one embodiment of the fabrication method of the invention subsequent to FIG. 5.

After the steps described above, the resistor is formed concomitantly with the formation of a CMOS semiconductor device. An example of fabrication sequence for an N-resistor consisting of single-crystal silicon that is the present embodiment is shown in FIGS. 6A-6D. Phosphorus, for example, is ion-implanted into the P-type silicon active layer 103, and an anneal is performed at 1000-1175° C. for from 30 minutes to 5 hours to diffuse phosphorus. An N-well diffusion layer 601 having a dopant concentration of about $1\times10^{16}$ to $1\times10^{17}$ atoms/cm$^3$, for example, is formed. At this time, formation of the N-single-crystal silicon region 109 of the N-resistor may be replaced by this ion implantation of N-well formation. Then, as shown in FIG. 6A, a field insulation film 602 is formed at a thickness reaching the buried insulation film 102 by a LOCOS method. The field insulation film 602 is formed herein after the formation of the N-well 601. The N-well may be formed after formation of the field insulation film.

Furthermore, as a dopant implantation method into a resistor region, a method including of performing patterning with photoresist and selectively ion-implanting N- and P-type dopants to form N-resistor and P-resistor separately may also be possible. At this time, the dopant implant into the N-single-crystal silicon region is at a concentration of about $1\times10^{14}$ to $9\times10^{18}$ atoms/cm$^3$, and arsenicum may be used for the ion implantation of phosphorous. The dopant implant into the p-single-crystal silicon region is at a concentration of about $1\times10^{14}$ to $9\times10^{18}$ atoms/cm$^3$, and boron or BF2 may be used for the ion implantation. with respect to formation of a more lightly doped resistor region, a desired resistance value can be obtained by making use of ion implantation for adjustment of a threshold value voltage.

Figure 6B:
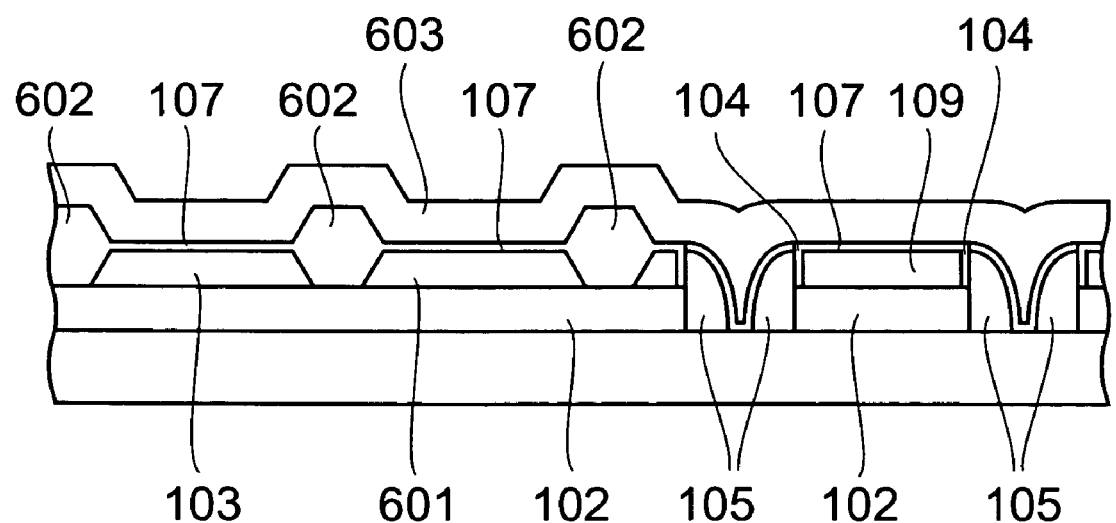

Then, the gate insulation film 107 is formed to 100 to 300 A by thermal oxidation. Ion implantation is done to obtain a desired threshold value voltage. Subsequently, the second polycrystalline silicon 603 becoming gate electrodes is deposited to about 2000 A to 4000 A, for example (FIG. 6B). Then, patterning is performed with photoresist to form the gate electrode 106.

Figure 6C:
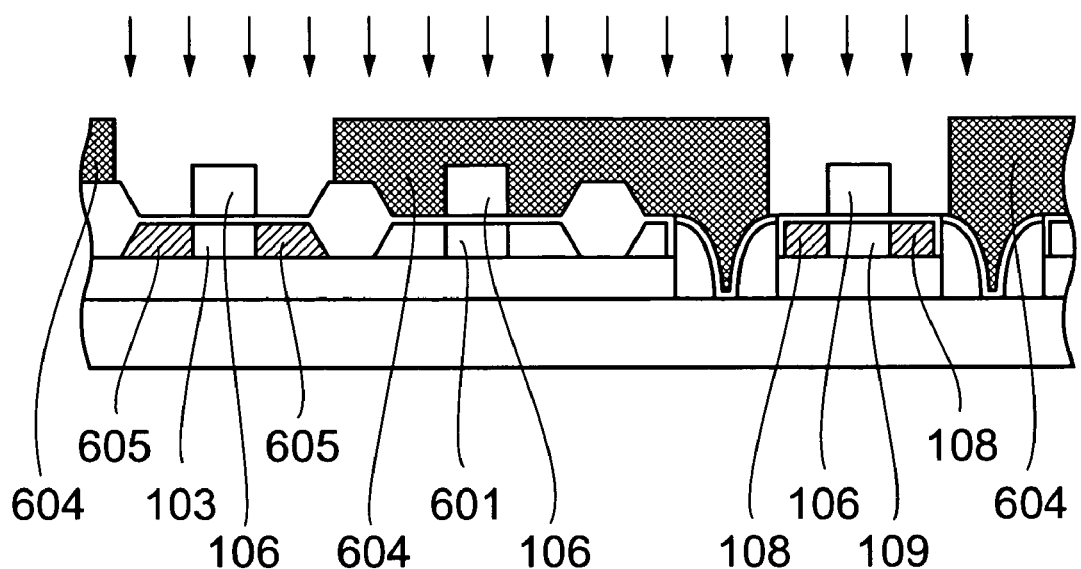
Figure 6D:
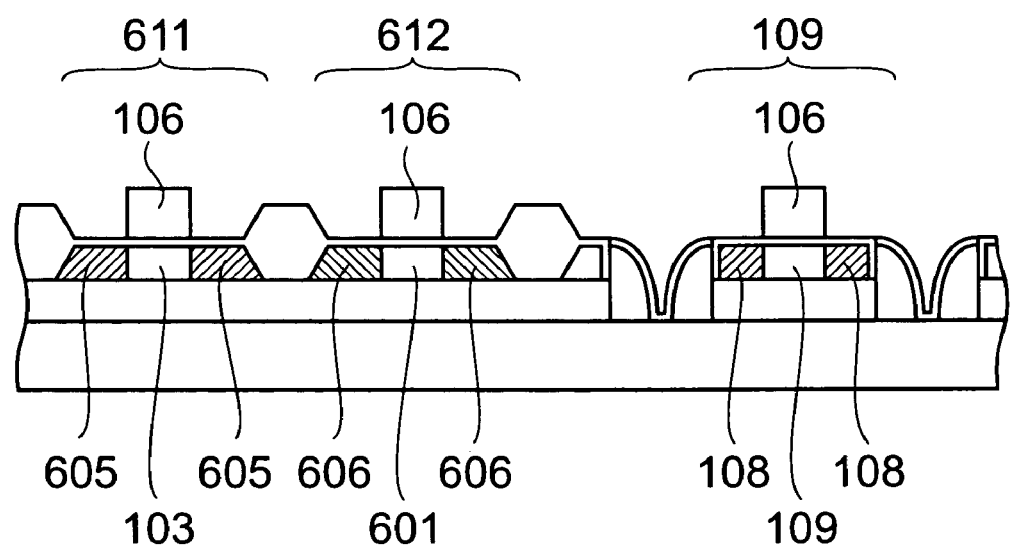

At this time, a gate electrode is also formed on top of the high-resistance region of the resistor that is a lightly doped region. This makes it possible to form a heavily doped diffusion electrode region in the resistor in a self-aligned manner in a later step. The accuracy of the length of the resistor can be improved. If unnecessary, it is possible to omit the gate electrode on top of the resistor. Then, ion implantation is performed with a patterned photoresist 604 to form a highly doped diffusion region becoming source and drain of NMOS and PMOS transistors. In FIG. 6C, it is performed simultaneously with ion implantation for formation of the heavily doped diffusion region 605 of the NMOS transistor 611 to form the heavily doped diffusion electrodes of the N-resistor, thus forming the N+ single-crystal silicon 108. Similarly, a heavily doped diffusion region 606 of the PMOS transistor 612 is formed (refer to FIG. 6D).

Then, formation of an intermediate insulation film, formation of contact holes, and formation of aluminum wiring pattern are performed in a manner not illustrated, in the same way as in the semiconductor process of related art. At this time, contact holes are formed also in the side spacer portions of the polycrystalline silicon. This makes it possible to control the potential at the side spacers. Furthermore, an aluminum wiring layer is formed on top of the resistor.

A complementary MOS semiconductor device having the single-crystal silicon resistors is formed through formation of its protective layer and its patterning.

While modes of practice of the present invention have been described using embodiments employing a P-type semiconductor substrate, in the case of an N substrate P well type where the polarity of the substrate is reversed and an N-type semiconductor substrate is used, similar advantages can be derived.

The present invention can offer a bleeder resistance circuit which has a high resistance, consumes a suppressed amount of electric power, and has a reduced area by forming a resistor from single-crystal silicon in a semiconductor device including CMOS and a resistance circuit. Furthermore, the structure is so designed that side spacers of a first polycrystalline silicon are formed over the sidewalls of the resistor via an insulation film and that a gate electrode consisting of a second polycrystalline silicon is formed on top of the resistor via a gate insulation film. Resistance value variations due to inter-substrate potential difference variations are suppressed. Accurate potential division is made possible.

What is claimed is:

1. A method of manufacturing a semiconductor device formed on an SOI substrate comprising a semiconductor support substrate, a buried insulation film formed on the semiconductor support substrate, and a silicon active layer formed on the buried insulation film, comprising the steps of:
   patterning the silicon active layer to form single-crystal silicon resistors;
   etching the silicon active layer and the buried insulation film to form an island-shape silicon active layer on an island-shape buried insulation film on the semiconductor support substrate to thereby form single-crystal silicon resistors;
   forming an insulation film to a thickness of 0.01 μm to 0.04 μm by thermal oxidation;
   depositing a first polycrystalline silicon to a thickness comparable to the depth from the silicon active layer to the semiconductor support substrate surface portion;
   etching the first polycrystalline silicon by anisotropic dry etching until the insulation film surface is exposed to form side spacers over sidewalls of step portions of the island-shape silicon active layer, the buried insulation film, and the semiconductor support substrate via the insulation film;
   implanting a dopant of a first conductivity type at $1\times10^{14}$ to $9\times10^{18}$ atoms/cm$^3$ into a whole or a first region of the single-crystal silicon resistors;
   implanting a dopant of a second conductivity type at $1\times10^{14}$ to $9\times10^{18}$ atoms/cm$^3$ into a second region of the single-crystal silicon resistors;
   forming a gate insulation film on the single-crystal silicon resistors and depositing a second polycrystalline silicon for gate electrodes;
   patterning and etching the second polycrystalline silicon to form gate electrodes over parts of the single-crystal silicon resistors;
   implanting a dopant of the first conductivity type at more than $1\times10^{19}$ atoms/cm$^3$ into some regions of the first region of the single-crystal silicon resistors;
   implanting a dopant of the second conductivity type at more than $1\times10^{19}$ atoms/cm$^3$ into some regions of the second region of the single-crystal silicon resistors;
   forming an intermediate insulation film on the SOI substrate;
   forming contact holes in the intermediate insulation film on the SOI substrate;
   forming metal lead wires in the contact holes; and
   forming a protective film.

2. A method of manufacturing a semiconductor device according to claim 1, wherein isotropic wet etching is used to remove the buried insulation film after removal of the silicon active layer.

3. A method of manufacturing a semiconductor device according to claim 1; wherein anisotropic dry etching is used to remove the buried insulation film after removal of the silicon active layer.

4. A method of manufacturing a semiconductor device according to claim 1; wherein the buried insulation film is removed by etching halfway through the buried insulation film by anisotropic dry etch and wet-etching the remaining buried insulation film isotropically after removal of silicon active layer.

5. A method of manufacturing a semiconductor device according to claim 1; wherein the dopant implantation of the first conductivity type into some regions of the first region of the single-crystal silicon resistors at more than $1\times10^{19}$ atoms/cm$^3$ is carried out simultaneously with doping of a diffusion region of a MOS transistor of the first conductivity type, and wherein the dopant implantation of the second conductivity type into some or whole region of the second region of the single-crystal silicon resistors is carried out simultaneously with doping of the diffusion region of a MOS transistor of the second conductivity type.

6. A method of manufacturing a semiconductor device formed on an SOI substrate comprising a semiconductor support substrate, a buried insulation film formed on the semiconductor support substrate, and a silicon active layer formed on the buried insulation film, comprising the steps of:

patterning the silicon active layer to form a single-crystal silicon resistor;

etching the silicon active layer and the buried insulation film to form an island-shape silicon active layer on an island-shape buried insulation film on the semiconductor support substrate to thereby form a single-crystal silicon resistor;

forming an insulation film to a thickness of 0.01 μm to 0.04 μm by thermal oxidation;

depositing a first polycrystalline silicon to a thickness comparable to the depth from the silicon active layer to the semiconductor support substrate surface portion;

etching the first polycrystalline silicon by anisotropic dry etching until the insulation film surface is exposed to form side spacers over sidewalls of step portions of the island-shape silicon active layer, the buried insulation film and the semiconductor support substrate via the insulation film;

implanting a dopant $1\times10^{14}$ to $9\times10^{18}$ atoms/cm$^3$ into a whole or a limited region of the single-crystal silicon resistor;

forming a gate insulation film on the single-crystal silicon resistor and depositing a second polycrystalline silicon for a gate electrode;

patterning and etching the second polycrystalline silicon to form a gate electrode over a part of the single-crystal silicon resistor;

implanting a dopant at more than $1\times10^{19}$ atoms/cm$^3$ into some region of the single-crystal silicon resistor;

forming an intermediate insulation film on the SOI substrate;

forming contact holes in the intermediate insulation film on the SOI substrate; forming metal lead wires in the contact holes; and forming a protective film.

* * * * *